United States Patent
Jeon et al.

(10) Patent No.: US 10,446,711 B2
(45) Date of Patent: Oct. 15, 2019

(54) THIN FILM TRANSISTOR ARRAY SUBSTRATE AND METHOD FOR MANUFACTURING THE SAME

(71) Applicant: LG DISPLAY CO., LTD., Seoul (KR)

(72) Inventors: Jinchae Jeon, Daegu (KR); Kisul Cho, Gyeongsangbuk-do (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/012,346

(22) Filed: Jun. 19, 2018

(65) Prior Publication Data
US 2018/0315885 A1  Nov. 1, 2018

Related U.S. Application Data

(62) Division of application No. 13/943,893, filed on Jul. 17, 2013, now Pat. No. 10,032,953.

(30) Foreign Application Priority Data

Sep. 24, 2012 (KR) .................. 10-2012-0105974

(51) Int. Cl.
*H01L 33/00* (2010.01)
*H01L 29/786* (2006.01)
*H01L 27/12* (2006.01)

(52) U.S. Cl.
CPC ........ *H01L 33/0041* (2013.01); *H01L 27/124* (2013.01); *H01L 27/1225* (2013.01); *H01L 29/78633* (2013.01); *H01L 29/78648* (2013.01)

(58) Field of Classification Search
CPC ........... H01L 33/0041; H01L 29/78648; H01L 29/78633; H01L 27/124; H01L 27/1225
(Continued)

(56) References Cited

U.S. PATENT DOCUMENTS 6,958,740 B1 * 10/2005 Nishikawa .......... H01L 27/3262
313/483
7,733,453 B2 * 6/2010 Ahn .................. G02F 1/134309
349/141
(Continued)

FOREIGN PATENT DOCUMENTS

CN     1770465 A    5/2006
CN     101093851 A   12/2007
(Continued)

OTHER PUBLICATIONS

Chinese Office Action issued in Chinese Patent Application No. 201310221579.X dated May 9, 2016.
(Continued)

*Primary Examiner* — Bo Fan
(74) *Attorney, Agent, or Firm* — Morgan, Lewis & Bockius LLP

(57) ABSTRACT

A thin film transistor array substrate and a method for manufacturing the same are disclosed. The thin film transistor array substrate includes a plurality of pixel units defined by a cross structure of gate lines with data lines and power lines on a substrate. Each of the pixel units includes a driving unit, which includes a switching thin film transistor and a driving thin film transistor receiving a signal from the gate line, the data line, and the power line, and a capacitor storing a signal; and a light emitting unit emitting light on a pixel electrode receiving a driving current from the driving thin film transistor. Each of a plurality of shielding patterns is positioned under the switching thin film transistor and the driving thin film transistor of the pixel unit.

12 Claims, 14 Drawing Sheets

(58) Field of Classification Search
USPC ........ 349/141, 43; 345/76; 313/483; 257/13, 257/43
See application file for complete search history.

(56) References Cited

U.S. PATENT DOCUMENTS

| | | | |
|---|---|---|---|
| 9,012,918 B2 | 4/2015 | Yamazaki et al. | |
| 9,705,003 B2 | 7/2017 | Yamazaki et al. | |
| 2005/0082540 A1 | 4/2005 | Nishikawa | |
| 2006/0145960 A1* | 7/2006 | Koga | G09G 3/3233 345/76 |
| 2008/0179587 A1* | 7/2008 | Namkoong | H01L 33/32 257/13 |
| 2008/0284933 A1* | 11/2008 | Ito | H01L 27/1225 349/43 |
| 2010/0051938 A1* | 3/2010 | Hayashi | H01L 29/7869 257/43 |
| 2010/0244029 A1 | 9/2010 | Yamazaki et al. | |
| 2011/0057186 A1 | 3/2011 | Yamazaki et al. | |
| 2011/0108846 A1* | 5/2011 | Choi | H01L 27/12 257/72 |
| 2013/0201085 A1* | 8/2013 | Chang | G09G 3/3258 345/76 |
| 2015/0214379 A1 | 7/2015 | Yamazaki et al. | |

FOREIGN PATENT DOCUMENTS

| | | |
|---|---|---|
| JP | 2002-352955 A | 12/2002 |
| KR | 10-1998-0071672 A | 10/1998 |
| KR | 2007-0122023 A | 12/2007 |
| KR | 2010-0108291 A | 10/2010 |

OTHER PUBLICATIONS

Chinese Office Action issued in Chinese Patent Application No. 201310221579.X dated Sep. 2, 2015.
Taiwan Office Action issued in Taiwanese Patent Application No. 102117276 dated Jun. 12, 2015.
Korean Office Action dated Feb. 7, 2019 for corresponding Korean patent application No. 10-2012-0105974.

* cited by examiner

THIN FILM TRANSISTOR ARRAY SUBSTRATE AND METHOD FOR MANUFACTURING THE SAME

This is a divisional of U.S. application Ser. No. 13/943,893, filed Jul. 17, 2013, which application claims the priority benefit of Korean Patent Application No. 10-2012-0105974 filed on Sep. 24, 2012, both of which are incorporated herein by reference for all purposes as if fully set forth herein.

BACKGROUND OF THE INVENTION

Field of the Invention

Embodiments of the invention relate to a thin film transistor array substrate and a method for manufacturing the same. More specifically, the embodiments of the invention relate to a thin film transistor array substrate and a method for manufacturing the same capable of improving characteristics of a thin film transistor by applying a voltage to a shielding pattern and performing a thermal process.

Discussion of the Related Art

The importance of flat panel displays is recently increasing with the growth of multimedia. Thus, various types of flat panel displays such as liquid crystal displays (LCDs), plasma display panels (PDPs), field emission displays (FEDs), and organic light emitting diode (OLED) displays have been put to practical use. Among the flat panel displays, the OLED display has excellent characteristics including a fast response time of 1 ms or less, low power consumption, a self-emitting structure, etc. Hence, there is no problem in a viewing angle of the OLED display. As a result, the OLED display has been considered as a next generation display.

A method for driving a display device is classified into a passive matrix driving method and an active matrix driving method using thin film transistors. In the passive matrix driving method, an anode and a cathode are configured so that they are perpendicular to each other, and lines are selected, thereby driving the display device. On the other hand, in the active matrix driving method, the thin film transistors are respectively connected to pixel electrodes, and the display device is driven by the voltage held by a capacitance of a capacitor connected to a gate electrode of the thin film transistor.

In addition to basic characteristics of the thin film transistor including a mobility, a leakage current, etc., durability and electrical reliability required to maintain long lifespan are very important in the thin film transistor. An active layer of the thin film transistor is generally formed of amorphous silicon or polycrystalline silicon. Amorphous silicon has the advantage of a reduction in the manufacturing cost of the active layer through a simple formation process. However, it is difficult to secure the electrical reliability. Further, it is very difficult to apply polycrystalline silicon to a large area device because of a high process temperature, and the uniformity of polycrystalline silicon based on a crystallization type is not secured.

When the active layer is formed of oxide, an excellent mobility of the thin film transistor may be obtained even if the active layer is formed at a low temperature. Further, because changes in a resistance of the active layer increase depending on an amount of oxygen, it is very easy to obtain desired physical properties of the thin film transistor. Therefore, in recent, an interest in the application of the thin film transistor is greatly increasing. In particular, examples of oxide used in the active layer include zinc oxide (ZnO), indium zinc oxide (InZnO), and indium gallium zinc oxide ($InGaZnO_4$).

However, because the thin film transistor including the active layer formed of oxide generates a light current by an external light source and thus shows unstable characteristic, the reliability of the thin film transistor is reduced.

SUMMARY OF THE INVENTION

Embodiments of the invention provide a thin film transistor array substrate and a method for manufacturing the same capable of improving characteristics of a thin film transistor by applying a voltage to a shielding pattern and performing a thermal process.

In one aspect, there is a thin film transistor array substrate comprising: a plurality of pixel units defined by a cross structure of gate lines with data lines and power lines on a substrate, each of the plurality of pixel units including: a driving unit, which includes a switching thin film transistor and a driving thin film transistor receiving a signal from the gate line, the data line, and the power line, and a capacitor storing a signal; and a light emitting unit emitting light on a pixel electrode receiving a driving current from the driving thin film transistor; and a plurality of shielding patterns, each of which is positioned under the switching thin film transistor and the driving thin film transistor of each pixel unit.

The shielding pattern of one pixel unit may be connected to the shielding patterns of other pixel units adjacent to the one pixel unit through shielding lines.

The shielding lines may connected to a constant voltage driver around an active area of the thin film transistor.

In addition, the switching thin film transistor and the driving thin film transistor each may have a top gate structure, and the shielding line is positioned to overlap at least one of the data line and the power line.

In addition, the switching thin film transistor and the driving thin film transistor each have a bottom gate structure, and the shielding line is positioned to overlap at least one of the data line and the power line.

Also, the switching thin film transistor and the driving thin film transistor each may include an etch stopper.

Moreover, each of the switching thin film transistor and the driving thin film transistor may be formed on a buffer layer positioned on the substrate, and the shielding pattern may be positioned between the substrate and the buffer layer.

Moreover, a constant voltage from the constant voltage driver may be applied to the shielding pattern through the shielding line.

Also, the shielding pattern may have a single layer or a multiple layer.

Also, the switching thin film transistor and the driving thin film transistor each may include an active layer which contains oxide and is dehydrated from hydrogen and/or hydroxide ions.

In another aspect, there is a method for manufacturing a thin film transistor array substrate comprising: forming a shielding pattern on a substrate, on which a plurality of pixel units each including a driving unit and a light emitting unit are to be defined; forming gate lines, data lines, power lines, a switching thin film transistor and a driving thin film transistor, wherein the switching thin film transistor and the driving thin film transistor each includes an active layer, a gate electrode, a source electrode, and a drain electrode, on the substrate, on which the shielding pattern is formed; and forming a pixel electrode connected to the thin film transistor, wherein the shielding pattern is formed under the switching thin film transistor and the driving thin film transistor.

In addition, the shielding pattern of one pixel unit may be connected to the shielding patterns of other pixel units adjacent to the one pixel unit through shielding lines.

In addition, the shielding lines may be connected to a constant voltage driver around an active area of the thin film transistor.

Also, the switching thin film transistor and the driving thin film transistor each may have a top gate structure, and the shielding line may be positioned to overlap at least one of the data line and the power line.

Also, the switching thin film transistor and the driving thin film transistor each may have a bottom gate structure, and the shielding line may be positioned to overlap at least one of the data line and the power line.

Moreover, the switching thin film transistor and the driving thin film transistor each may include an etch stopper.

Moreover, each of the switching thin film transistor and the driving thin film transistor is formed on a buffer layer positioned on the substrate, and the shielding pattern is positioned between the substrate and the buffer layer.

Also, a constant voltage from the constant voltage driver may be applied to the shielding pattern through the shielding line.

Also, the shielding pattern may have a single layer or a multiple layer.

Also, the active layer may contain oxide and after forming the active layer, the active layer may be dehydrated from hydrogen and/or hydroxide ions by a thermal process performed at about 300° C. to 800° C.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE EMBODIMENTS

Reference will now be made in detail to embodiments of the invention, examples of which are illustrated in the accompanying drawings. Wherever possible, the same reference numbers will be used throughout the drawings to refer to the same or like parts. It will be paid attention that detailed description of known arts will be omitted if it is determined that the arts might mislead the embodiments of the invention.

Figure 1:
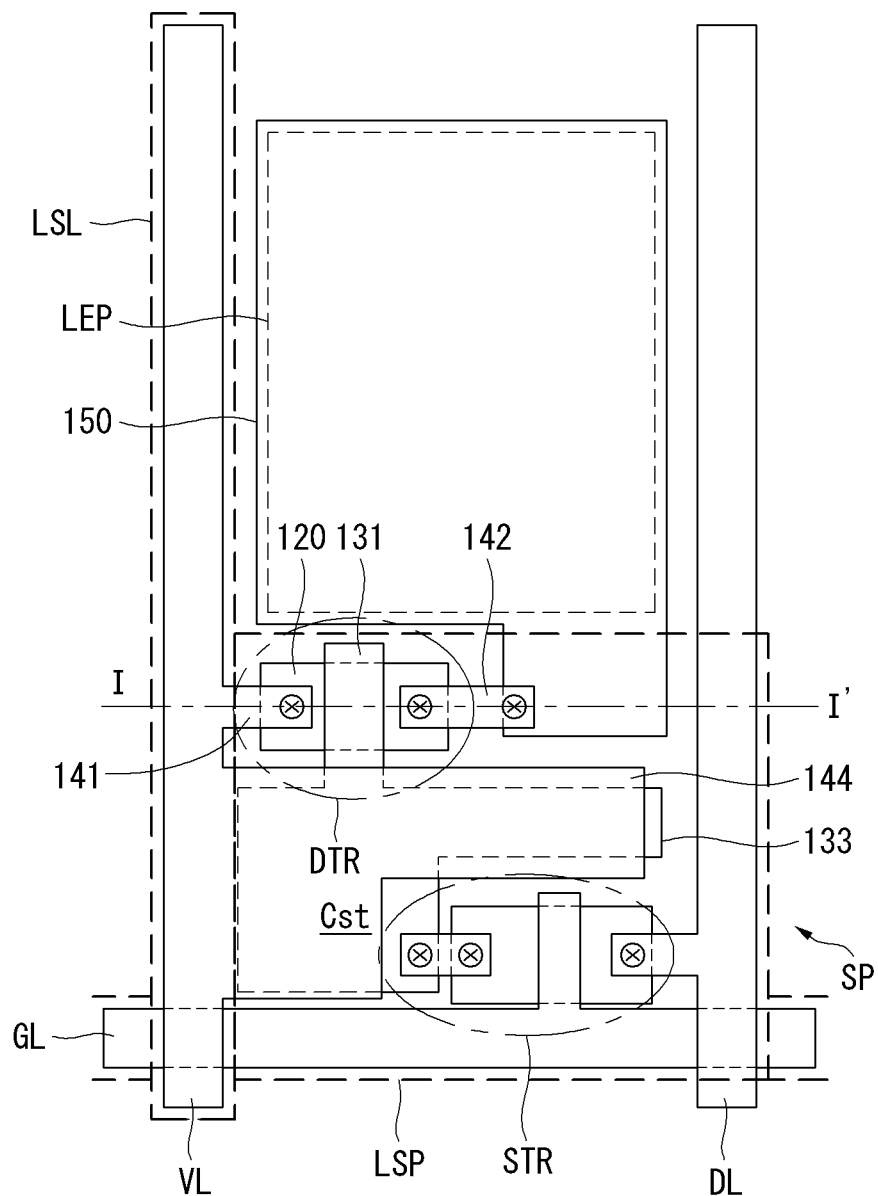
FIG. 1 is a plane view of a thin film transistor array substrate according to an embodiment of the invention, and illustrates a configuration of one pixel of a plurality of pixels as an example.
Figure 2:
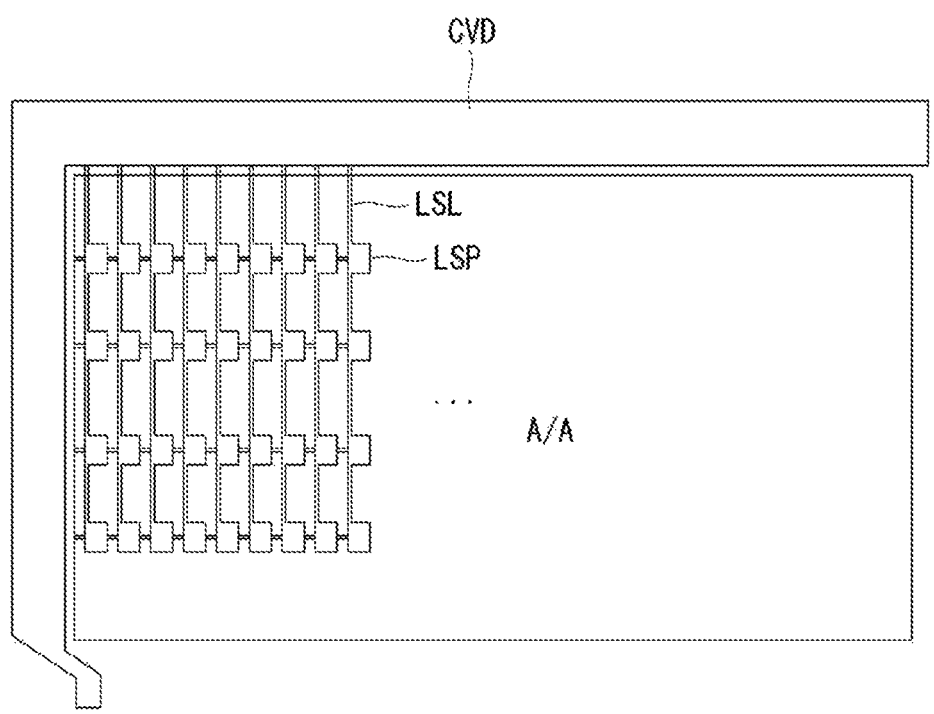
FIG. 2 is a plane view showing an arrangement of shielding patterns and shielding lines in a thin film transistor array substrate according to an embodiment of the invention.
Figure 3:
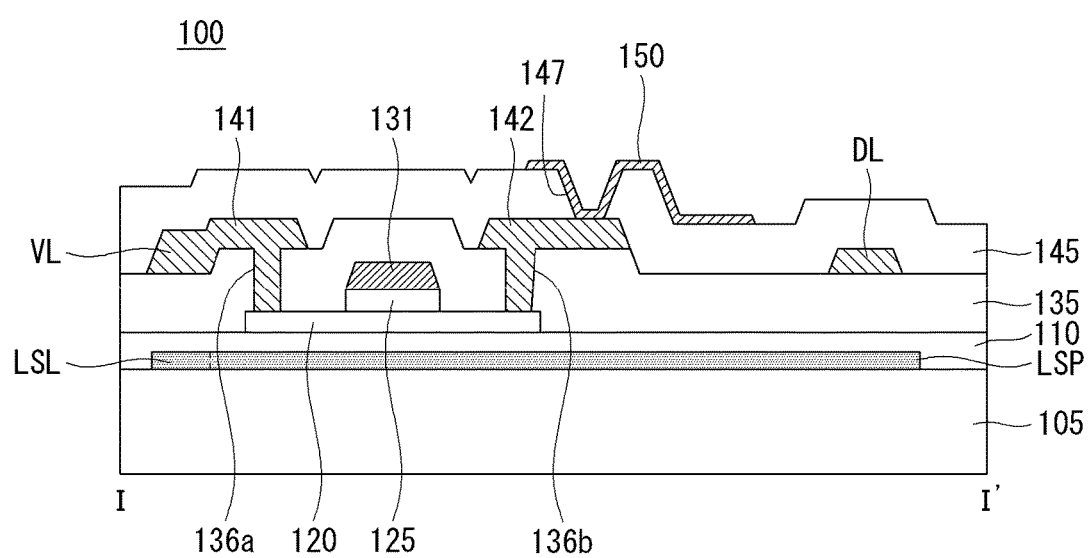
FIG. 3 is a cross-sectional view taken along line I-I' of FIG. 1.

FIG. 1 is a plane view of a thin film transistor array substrate according to an embodiment of the invention, and illustrates a configuration of one pixel of a plurality of pixels as an example. FIG. 2 is a plane view showing an arrangement of shielding patterns and shielding lines in the thin film transistor array substrate. FIG. 3 is a cross-sectional view taken along line I-I' of FIG. 1. FIGS. 4A to 4E are cross-sectional views sequentially illustrating each stage in a method for manufacturing the thin film transistor array substrate according to the embodiment of the invention.

As shown in FIG. 1, a substrate (not shown) including a plurality of pixel units SP is provided. The pixel units SP are defined by gate lines GL arranged in one direction, data lines DL arranged vertical to the gate lines GL, and power lines VL arranged parallel to the data lines DL.

Each of the pixel units SP includes a switching thin film transistor STR connected to the gate line GL and the data line DL, a capacitor Cst connected to the switching thin film transistor STR and the power line VL, and a driving thin film transistor DTR connected to the capacitor Cst and the power line VL. The capacitor Cst includes a capacitor lower electrode 133 and a capacitor upper electrode 144. A formation area of the gate line GL, the data line DL, the power line VL, the switching thin film transistor STR, the capacitor Cst, and the driving thin film transistor DTR is defined as a driving unit DP.

A light emitting diode includes a pixel electrode 150 electrically connected to the driving thin film transistor DTR, a light emitting layer (not shown) on the pixel electrode 150, and an opposite electrode (not shown). In the embodiment of the invention, a part, which is positioned on the pixel electrode 150 and emits light by the light emitting layer, is defined as a light emitting unit LEP.

A shielding pattern LSP is positioned in each pixel unit SP to shield the switching thin film transistor STR and the driving thin film transistor DTR of each pixel unit SP from light. For this, the shielding pattern LSP is positioned in a formation area of the switching thin film transistor STR and the driving thin film transistor DTR. Namely, the shielding pattern LSP is positioned in the driving unit DP excluding the light emitting unit LEP from the pixel unit SP. The shielding pattern LSP of one pixel unit SP is connected to the shielding patterns LSP of other pixel units SP adjacent to the one pixel unit SP through shielding lines LSL. The shielding line LSL is positioned to overlap the power line VL, but the embodiment of the invention is not limited thereto. For example, the shielding line LSL may be positioned to overlap at least one of the gate line GL and the data line DL.

More specifically, as shown in FIG. 2, a thin film transistor array according to the embodiment of the invention includes an active area A/A, which includes a plurality of pixels (not shown) and displays an image. The shielding patterns LSP are respectively disposed on the plurality of pixels and are connected to each other through the shielding lines LSL. The shielding lines LSL used to connect the shielding patterns LSP have a mesh structure and are formed in the active area A/A.

A constant voltage driver CVD is positioned around the active area A/A and applies a constant voltage to the shielding lines LSL. Each of the shielding lines LSL is connected to the constant voltage driver CVD on the upper side of the active area A/A and receives the constant voltage from the constant voltage driver CVD. When the constant voltage is applied to the shielding pattern LSP through the shielding line LSL, the shielding pattern LSP serves as a double gate electrode along with a gate electrode of the thin film transistor, thereby improving initial characteristic dispersion of the thin film transistor. Hence, the reliability of the thin film transistor may be improved.

The thin film transistor array substrate according to the embodiment of the invention is described in detail below.

As shown in FIG. 3, the shielding pattern LSP is positioned on a substrate 105, and a buffer layer 110 is positioned on the shielding pattern LSP. An active layer 120 containing oxide is positioned on the buffer layer 110, and a gate insulating layer 125 and a gate electrode 131 are positioned on a portion of the active layer 120. An interlayer dielectric layer 135 is positioned on the gate insulating layer 125 with the gate electrode 131 thereon. A source electrode 141 and a drain electrode 142 are positioned on the interlayer dielectric layer 135 and are connected to the active layer 120 through contact holes 136a and 136b exposing both sides of the active layer 120. The source electrode 141 is connected to the power line VL, and the data line DL is positioned on one area of the interlayer dielectric layer 135. Hence, the driving thin film transistor DTR including the active layer 120, the gate electrode 131, the source electrode 141, and the drain electrode 142 is configured.

A passivation layer 145 is positioned on the driving thin film transistor DTR, and the pixel electrode 150 is positioned on the passivation layer 145 and is connected to the drain electrode 142 through a via hole 147 exposing the drain electrode 142. Hence, a thin film transistor array substrate 100 according to the embodiment of the invention is configured.

A method for manufacturing the thin film transistor array substrate according to the embodiment of the invention is described in detail below with reference to FIGS. 4A to 4E.

Figure 4A:
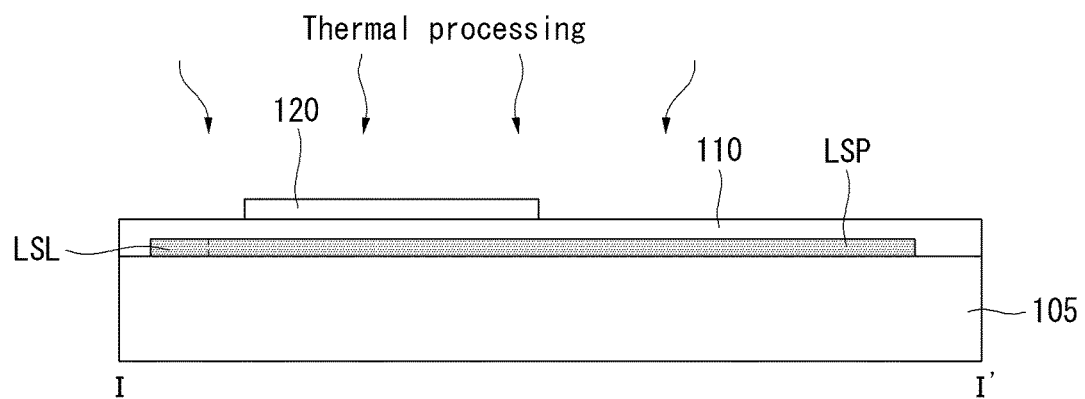
FIGS. 4A to 4E are cross-sectional views sequentially illustrating each stage in a method for manufacturing a thin film transistor array substrate according to an embodiment of the invention.

As shown in FIG. 4A, the shielding pattern LSP is formed on the substrate 105. The shielding pattern LSP may be formed of a material capable of blocking light. The shielding pattern LSP according to the embodiment of the invention may has a single layer or multiple layers with similar coefficients of thermal expansion. Because in some conditions, if the shielding pattern LSP has multiple layers formed of different materials, the multiple layers of the shielding pattern LSP may be damaged because of different coefficients of thermal expansion of the multiple layers in the subsequent thermal process. Preferably, the shielding pattern LSP according to the embodiment of the invention has a single layer in consideration of the contraction of the shielding pattern LSP due to a high temperature in a subsequent thermal process of an active layer. For example, the shielding pattern LSP may be formed of a metal material such as chrome (Cr), titanium (Ti), and molybdenum (Mo).

The buffer layer 110 is formed on the substrate 105, on which the shielding pattern LSP is formed. The buffer layer 110 is formed so as to protect a thin film transistor, which will be formed in a subsequent process, from impurities, for example, alkali ions coming from the substrate 105. The buffer layer 110 may be selectively formed using silicon dioxide ($SiO_2$), silicon nitride ($SiNx$), etc. The substrate 105 may be formed of glass, plastic, or metal.

Subsequently, amorphous zinc oxide-based composite semiconductor, in particular, a-IGZO semiconductor may be formed on the buffer layer 110 through a sputtering method using a composite oxide target of gallium oxide ($Ga_2O_3$), indium oxide ($In_2O_3$), and zinc oxide (ZnO). Alternatively, a chemical vapor deposition (CVD) method or an atomic layer deposition (ALD) method may be used. In the embodiment of the invention, the amorphous zinc oxide-based composite semiconductor may be deposited using the composite oxide target, in which an atom ratio of gallium (Ga), indium (In), and zinc (Zn) is about 1:1:1, 2:2:1, 3:2:1, or 4:2:1. When the atom ratio of gallium (Ga), indium (In), and zinc (Zn) contained in the composite oxide target is about 2:2:1, an equivalent weight ratio of gallium (Ga), indium (In), and zinc (Zn) may be about 2.8:2.8:1. Further, the amorphous zinc oxide-based composite semiconductor according to the embodiment of the invention may be variously deposited depending on other process conditions. However, the amorphous zinc oxide-based composite semiconductor may be deposited on condition that a percentage (i.e., an oxygen concentration) of a flow amount of oxygen with respect to a flow amount of oxygen and a flow amount of argon injected at a deposition velocity of about 1 to 200 Å/sec is about 1 to 40%.

The amorphous zinc oxide-based composite semiconductor is patterned through the thermal process to form the active layer 120. The thermal process is a dehydration process for removing hydrogen ($H_2$ and H) or hydroxide ions (OH) contained in the active layer 120. The thermal process may use a rapid thermal anneal (RTA) process using an inactive gas of a high temperature. The dehydration process removes hydrogen ($H_2$ and H) or hydroxide ions (OH) preventing a movement of carriers inside the active layer 120, thereby improving characteristic of the active layer 120. The thermal process may be performed at about 300° C. to 800° C., preferably, at a temperature equal to or higher than about 500° C. Further, the thermal process may be performed for about 1 minute to 30 minutes. For example, the RTA process may be performed at about 650° C. for about 3 to 6 minutes.

Figure 4B:
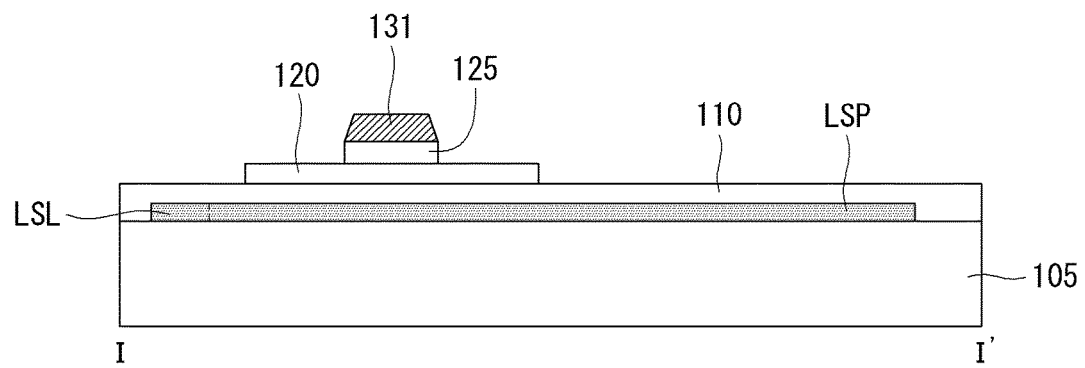

Next, as shown in FIG. 4B, silicon oxide (SiOx) or silicon nitride (SiNx) is stacked on the active layer 120. Then, one selected from the group consisting of copper (Cu), molybdenum (Mo), aluminum (Al), chrome (Cr), gold (Au), titanium (Ti), nickel (Ni), neodymium (Nd), tantalum (Ta), and tungsten (W), or a combination thereof is stacked on the stacked silicon oxide (SiOx) or silicon nitride (SiNx) and is etched to form the gate insulating layer 125 and the gate electrode 131.

The gate electrode 131 is formed on a portion of the active layer 120, in which a channel region will be formed. Further, the gate electrode 131 may have multiple layers in which each layer are formed of one selected from the group consisting of copper (Cu), molybdenum (Mo), aluminum (Al), chrome (Cr), gold (Au), titanium (Ti), nickel (Ni), neodymium (Nd), tantalum (Ta), and tungsten (W), or a combination thereof.

Figure 4C:
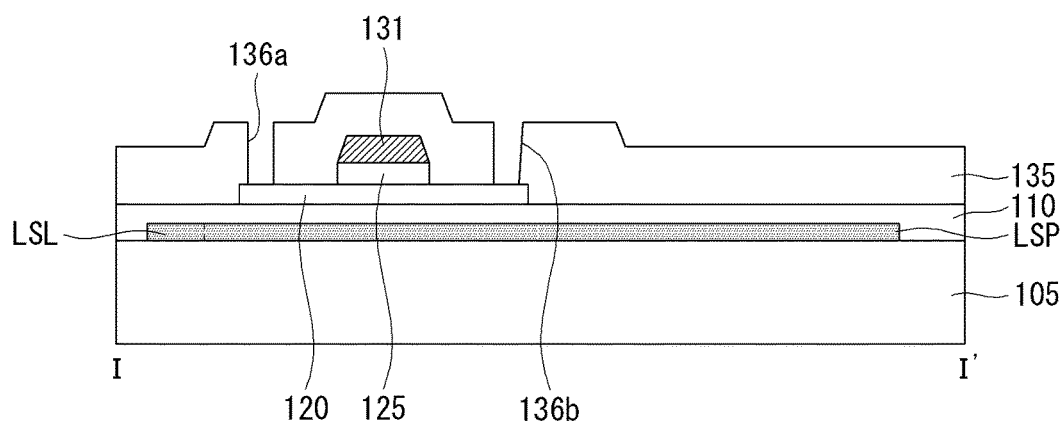

Next, as shown in FIG. 4C, silicon oxide (SiOx), silicon nitride (SiNx), or both are stacked on the substrate 105, on which the gate electrode 131 is formed, to form the interlayer dielectric layer 135. A portion of the interlayer dielectric layer 135 corresponding to both sides of the active layer 120 is etched to form the contact holes 136a and 136b exposing the active layer 120.

Figure 4D:
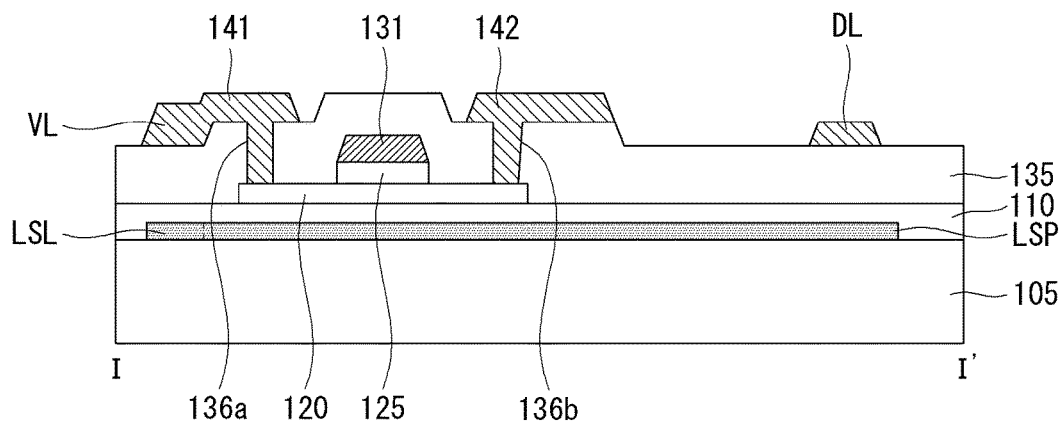

Next, as shown in FIG. 4D, the source electrode 141, the drain electrode 142, and the data line DL are formed on the substrate 105, on which the interlayer dielectric layer 135 is formed. Although not shown, the power line is simultaneously formed. Each of the source electrode 141, the drain electrode 142, and the data line DL may have a single layer or multiple layers. When the source electrode 141, the drain electrode 142, and the data line DL each have the single layer, they may be formed of one selected from the group consisting of molybdenum (Mo), aluminum (Al), chrome (Cr), gold (Au), titanium (Ti), nickel (Ni), neodymium (Nd), and copper (Cu), or a combination thereof. When the source electrode 141 and the drain electrode 142 each have the multiple layers, they may have a double layer formed of Mo/Al—Nd, Mo/Al, or Ti/Al or a triple layer formed of Mo/Al-Nd/Mo, Mo/Al/Mo, or Ti/Al/Ti. Thus, the thin film transistor including the active layer 120, the gate electrode 131, the source electrode 141, and the drain electrode 142 is formed.

Figure 4E:
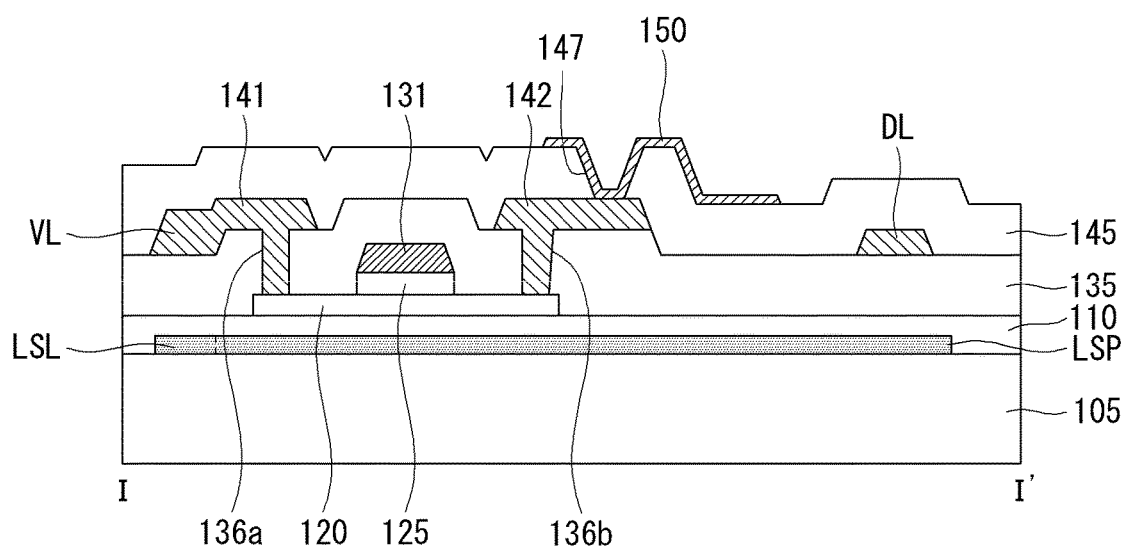

Next, as shown in FIG. 4E, silicon oxide (SiOx), silicon nitride (SiNx), or both are stacked on the substrate 105, on which the source electrode 141 and the drain electrode 142 are formed, to form the passivation layer 145. A portion of the passivation layer 145 corresponding to the drain electrode 142 is etched to form the via hole 147 exposing the drain electrode 142.

Subsequently, the pixel electrode 150 is formed on the substrate 105, on which the passivation layer 145 is formed. The pixel electrode 150 may be formed of a transparent conductive material, for example, indium tin oxide (ITO) or indium zinc oxide (IZO). The pixel electrode 150 is connected to the drain electrode 142 through the via hole 147. Thus, the thin film transistor array substrate 100 according to the embodiment of the invention is manufactured.

Figure 5:
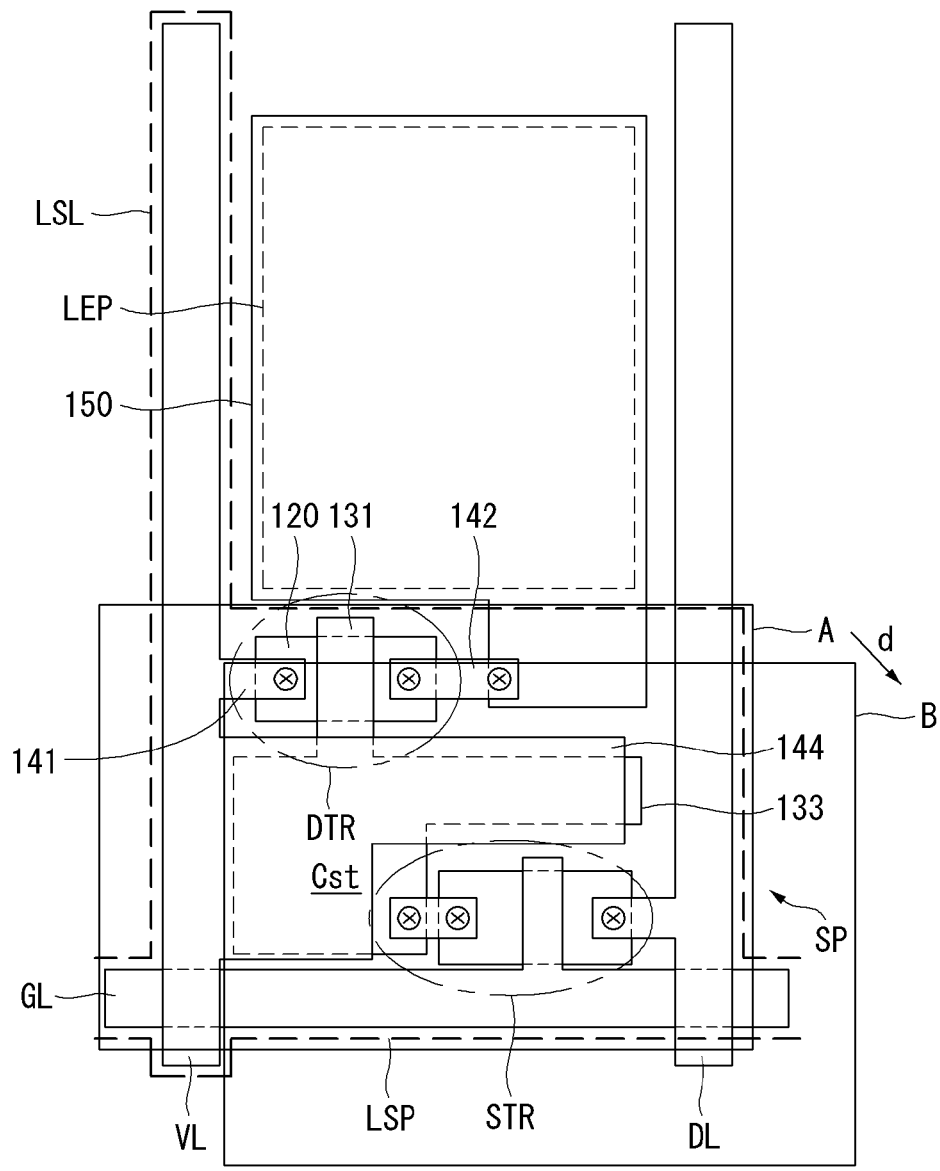
FIG. 5 illustrates a position shift of a shielding pattern before and after a thermal process is performed on an active layer.

FIG. 5 illustrates a position shift of the shielding pattern before and after the thermal process is performed on the active layer. As shown in FIG. 5, when the thermal process is performed on the active layer, the glass substrate may be contracted due to a high temperature of the thermal process. In this instance, the shielding pattern LSP formed on the substrate is shifted by the contraction of the substrate. Namely, the shielding pattern LSP formed on the substrate is shifted by about 15 μm from an original formation position 'A' to left and right and up and down and thus moves to a final position 'B'. Because a shift distance 'd' of the shielding pattern LSP is included in a shift margin of the shielding pattern LSP, it does not matter.

A thin film transistor array substrate according to another embodiment of the invention may include a thin film transistor having a bottom gate structure which means a gate electrode is under an active layer, unlike the above-described embodiment which discloses a top gate structure, that is, a gate electrode above an active layer.

Figure 6:
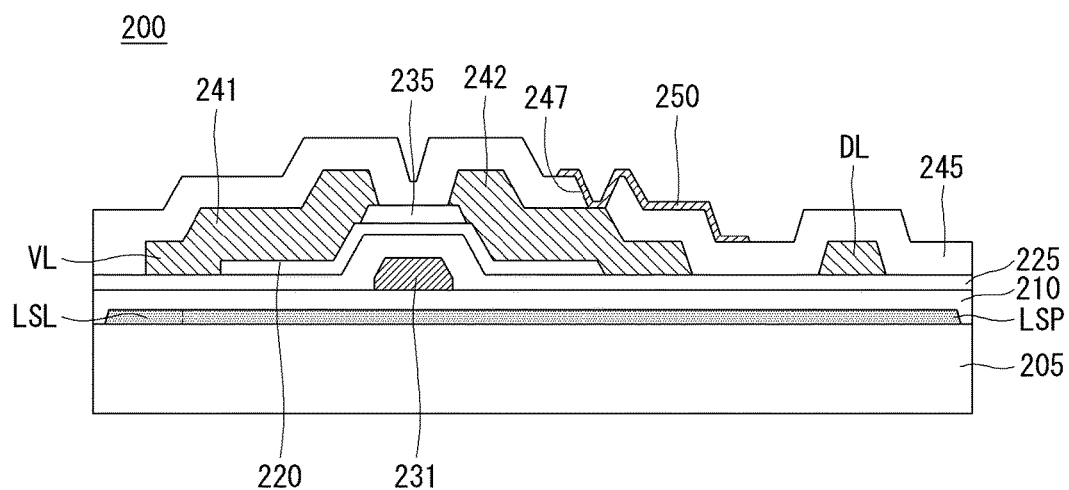
FIG. 6 is a cross-sectional view of a thin film transistor array substrate according to another embodiment of the invention.

FIG. 6 is a cross-sectional view of a thin film transistor array substrate according to another embodiment of the invention. FIGS. 7A to 7D are cross-sectional views sequentially illustrating each stage in a method for manufacturing a thin film transistor array substrate according to another embodiment of the invention.

As shown in FIG. 6, a shielding pattern LSP is positioned on a substrate 205, and a buffer layer 210 is positioned on the shielding pattern LSP. A gate electrode 231 is positioned on the buffer layer 210, and a gate insulating layer 225 is positioned on the gate electrode 231. An active layer 220 containing oxide is positioned on the gate insulating layer 225, and an etch stopper 235 is positioned on a portion of the active layer 220. A source electrode 241 and a drain electrode 242 are positioned on a portion of the etch stopper 235 and respectively cover both ends of the active layer 220. The source electrode 241 is connected to a power line VL, and a data line DL is positioned in an area separated from the drain electrode 242. Hence, a thin film transistor including the active layer 220, the gate electrode 231, the source electrode 241, and the drain electrode 242 is configured.

A passivation layer 245 is positioned on the substrate 205 including the source electrode 241 and the drain electrode 242. A pixel electrode 250 is positioned on the passivation layer 245 and is connected to the drain electrode 242 through a via hole 247. Hence, a thin film transistor array substrate 200 according to the embodiment of the invention is configured.

A method for manufacturing the thin film transistor array substrate 200 shown in FIG. 6 is described in detail below with reference to FIGS. 7A to 7D. A description of the same manufacturing method as FIGS. 4A to 4E may be briefly made or may be entirely omitted below.

Figure 7A:
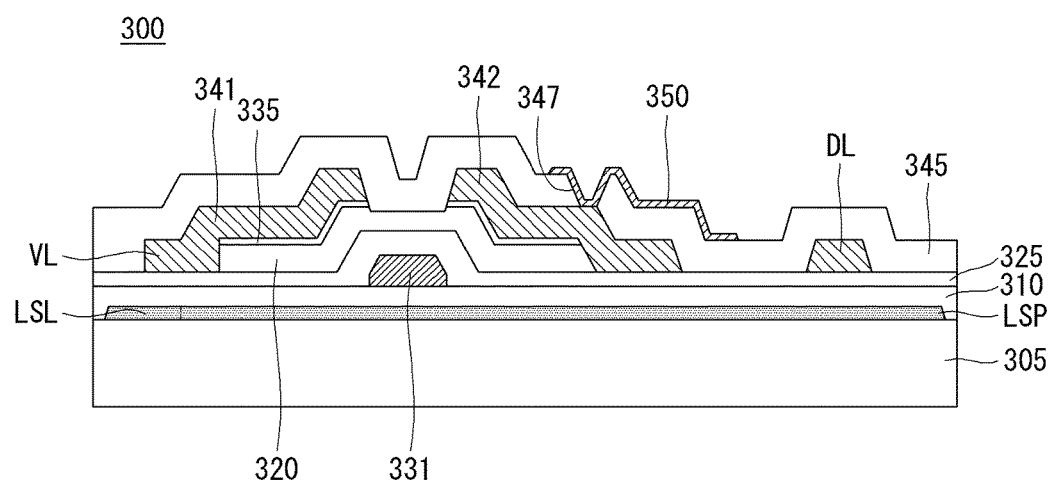
FIGS. 7A to 7D are cross-sectional views sequentially illustrating each stage in a method for manufacturing a thin film transistor array substrate according to another embodiment of the invention.

As shown in FIG. 7A, the shielding pattern LSP is formed on the substrate 205, and the buffer layer 210 is formed on the substrate 205, on which the shielding pattern LSP is formed. Subsequently, the gate electrode 231 is formed on the buffer layer 210, and the gate insulating layer 225 is formed on the gate electrode 231. Subsequently, one of zinc oxide (ZnO), indium zinc oxide (InZnO), zinc tin oxide (ZnSnO), and indium gallium zinc oxide (InGaZnO$_4$) is stacked on the gate insulating layer 225 and is patterned through a thermal process, thereby forming the active layer 220. Preferably, indium gallium zinc oxide (InGaZnO$_4$) may be used to form the active layer 220.

Figure 7B:
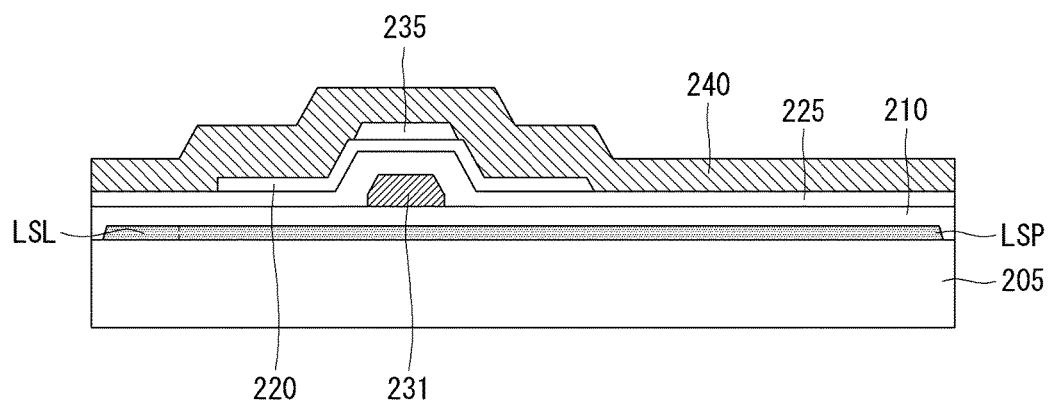

Next, as shown in FIG. 7B, silicon oxide (SiOx) or silicon nitride (SiNx) is stacked on the active layer 220 and is patterned to form the etch stopper 235. The etch stopper 235 prevents a damage of the active layer 220 underlying the source electrode 241 and the drain electrode 242 in a subsequent process for patterning the source electrode 241 and the drain electrode 242. Subsequently, one selected from the group consisting of molybdenum (Mo), aluminum (Al), chrome (Cr), gold (Au), titanium (Ti), nickel (Ni), neodymium (Nd), and copper (Cu), or a combination thereof is stacked on the substrate 205 including the etch stopper 235 to form a metal layer 240.

Figure 7C:
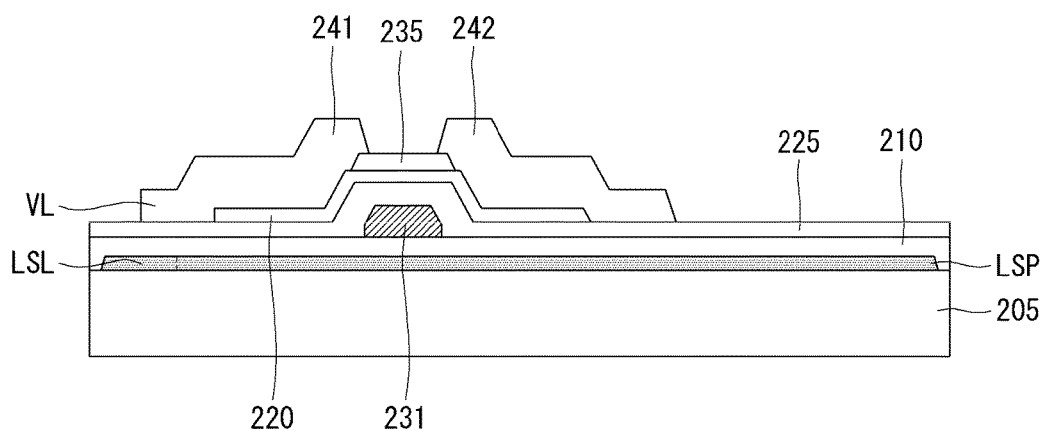

Next, as shown in FIG. 7C, the metal layer 240 is patterned to form the source electrode 241 and the drain electrode 242 which are positioned on a portion of the etch stopper 235 and are connected to the active layer 220. Thus, the thin film transistor including the gate electrode 231, the active layer 220, the source electrode 241, and the drain electrode 242 is formed.

Figure 7D:
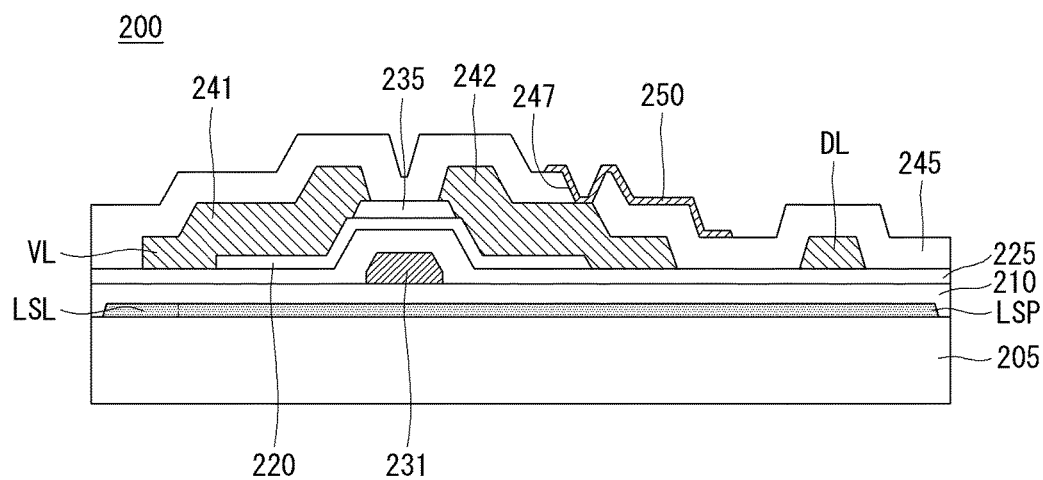

Next, as shown in FIG. 7D, the passivation layer 245 is positioned on the substrate 205, on which the source electrode 241 and the drain electrode 242 are formed. A portion of the passivation layer 245 corresponding to the drain electrode 242 is etched to form the via hole 247 exposing the drain electrode 242. Subsequently, the pixel electrode 250 is formed on the substrate 205, on which the passivation layer 245 is formed. Thus, the thin film transistor array substrate 200 according to the embodiment of the invention is manufactured.

Figure 8:
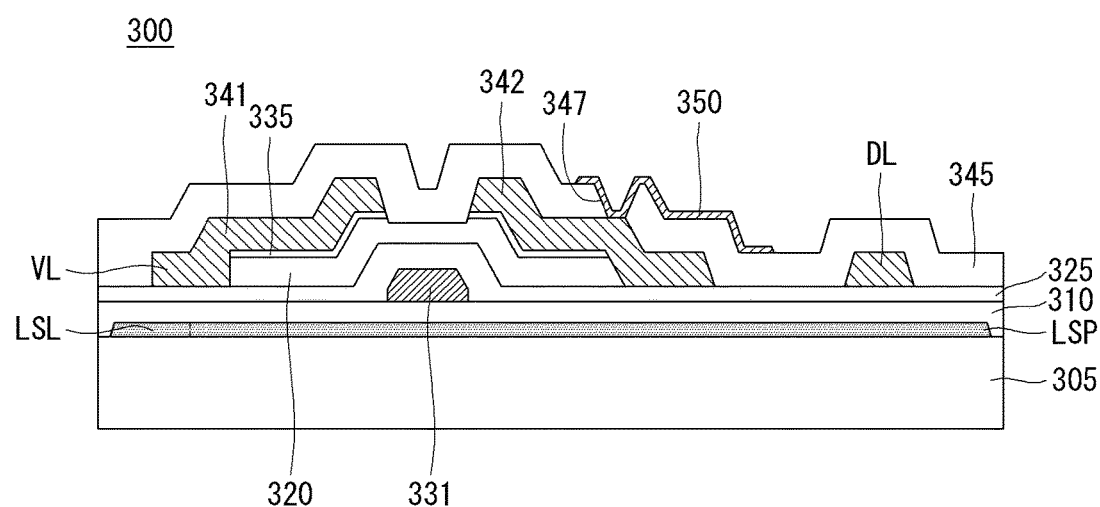
FIG. 8 is a cross-sectional view of a thin film transistor array substrate according to yet another embodiment of the invention.

A thin film transistor array substrate according to yet another embodiment of the invention may include a thin film transistor having a back channel etch structure, unlike the above-described embodiments. FIG. 8 is a cross-sectional view of a thin film transistor array substrate according to yet another embodiment of the invention. FIGS. 9A to 9E are cross-sectional views sequentially illustrating each stage in a method for manufacturing a thin film transistor array substrate according to yet another embodiment of the invention.

As shown in FIG. 8, a shielding pattern LSP is positioned on a substrate 305, and a buffer layer 310 is positioned on the shielding pattern LSP. A gate electrode 331 is positioned on the buffer layer 310, and a gate insulating layer 325 is positioned on the gate electrode 331. An active layer 320 containing oxide is positioned on the gate insulating layer 325, and ohmic contact layers 335 are respectively positioned on both sides of the active layer 320. A source electrode 341 and a drain electrode 342 are respectively positioned on the ohmic contact layers 335 and cover both ends of the active layer 320. The source electrode 341 is connected to a power line VL, and a data line DL is positioned in an area separated from the drain electrode 342. Hence, a thin film transistor including the active layer 320, the gate electrode 331, the ohmic contact layer 335, the source electrode 341, and the drain electrode 342 is configured.

A passivation layer 345 is positioned on the substrate 305 including the source electrode 341 and the drain electrode 342. A pixel electrode 350 is positioned on the passivation layer 345 and is connected to the drain electrode 342 through a via hole 347. Hence, a thin film transistor array substrate 300 according to the embodiment of the invention is configured.

A method for manufacturing the thin film transistor array substrate 300 shown in FIG. 8 is described in detail below with reference to FIGS. 9A to 9E. A description of the same manufacturing method as FIGS. 7A to 7D may be briefly made or may be entirely omitted below.

Figure 9A:
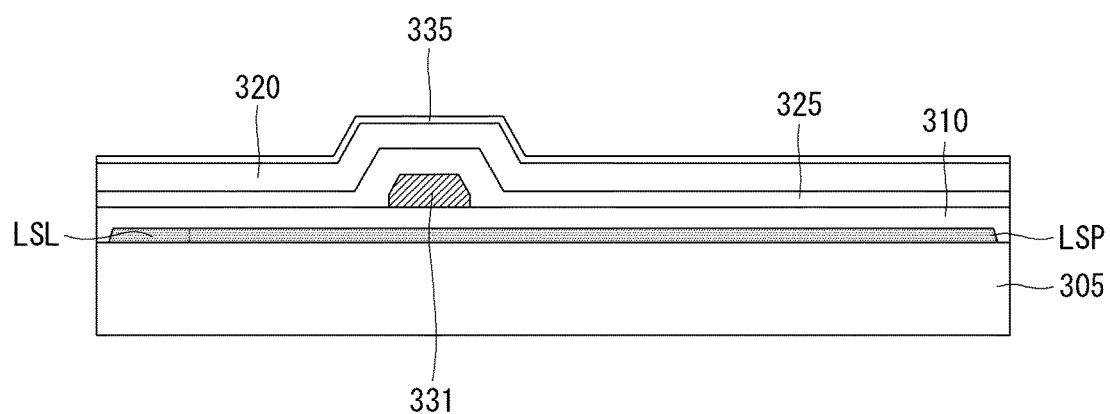
FIGS. 9A to 9E are cross-sectional views sequentially illustrating each stage in a method for manufacturing a thin film transistor array substrate according to yet another embodiment of the invention.

As shown in FIG. 9A, the shielding pattern LSP is formed on the substrate 305, and the buffer layer 310 is formed on the substrate 305, on which the shielding pattern LSP is formed. Subsequently, the gate electrode 331 is formed on the buffer layer 310, and the gate insulating layer 325 is formed on the gate electrode 331. Subsequently, one of zinc oxide (ZnO), indium zinc oxide (InZnO), zinc tin oxide (ZnSnO), and indium gallium zinc oxide (InGaZnO$_4$) is stacked on the gate insulating layer 325 to form an oxide layer 322. Subsequently, amorphous silicon is stacked on the oxide layer 322 to form an amorphous silicon layer 333.

Figure 9B:
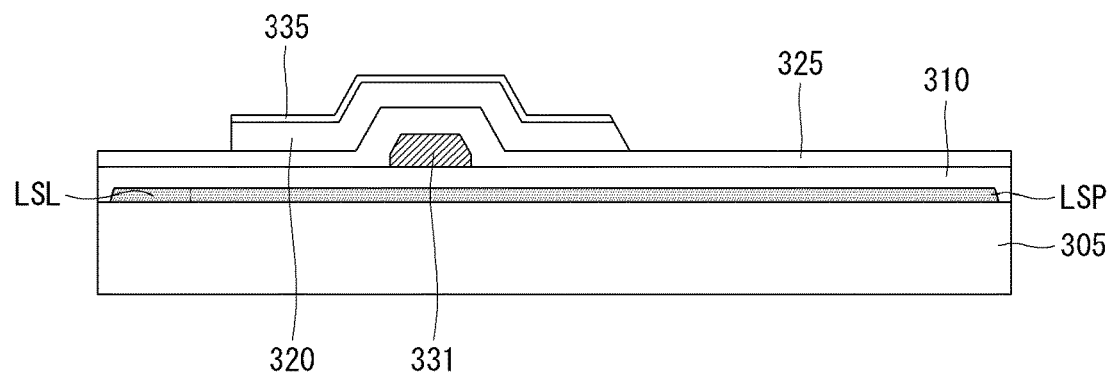

Next, as shown in FIG. 9B, a thermal process is performed on the substrate 305, on which the oxide layer 322 and the amorphous silicon layer 333 are formed, to pattern the oxide layer 322 and the amorphous silicon layer 333. Hence, the active layer 320 and the ohmic contact layer 335 are formed. The ohmic contact layer 335 improves ohmic characteristic between the source electrode and the drain electrode, which will be formed later, and the active layer and on-current characteristic of the thin film transistor.

Figure 9C:
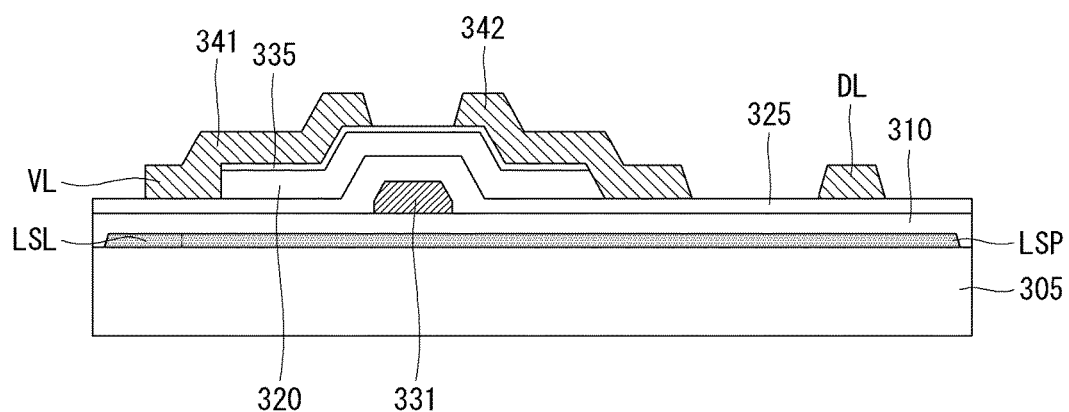

Next, as shown in FIG. 9C, one selected from the group consisting of molybdenum (Mo), aluminum (Al), chrome (Cr), gold (Au), titanium (Ti), nickel (Ni), neodymium (Nd), and copper (Cu), or a combination thereof is stacked on the substrate 305, on which the active layer 320 and the ohmic contact layer 335 are formed, and is patterned to form the source electrode 341 and the drain electrode 342 which are connected to the active layer 320 through the ohmic contact layer 335.

Figure 9D:
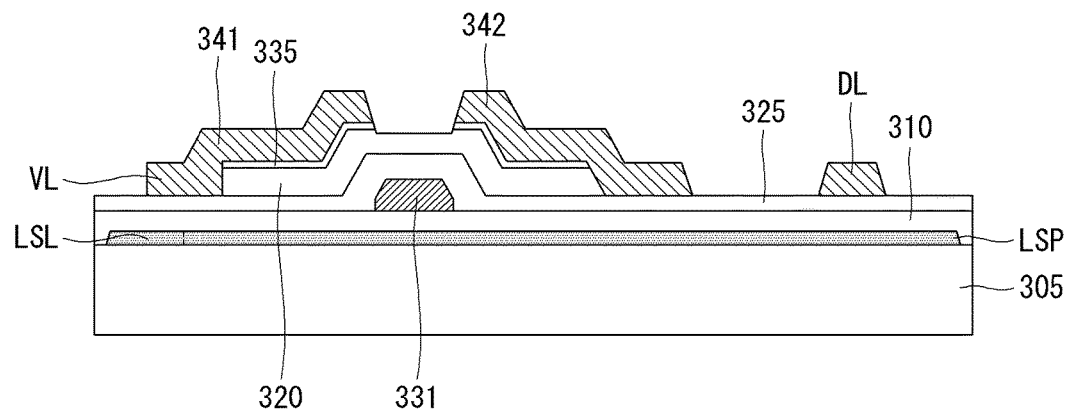

Next, as shown in FIG. 9D, the ohmic contact layer 335 is etched through a back channel etch process using the source electrode 341 and the drain electrode 342 as a block layer, and thus a portion of the active layer 320 corresponding to the gate electrode 331 is exposed. Hence, a channel of the active layer 320 is defined, and the ohmic contact layer 335 is divided and separated. As a result, the thin film transistor including the gate electrode 331, the active layer 320, the ohmic contact layer 335, the source electrode 341, and the drain electrode 342 is formed.

Figure 9E:
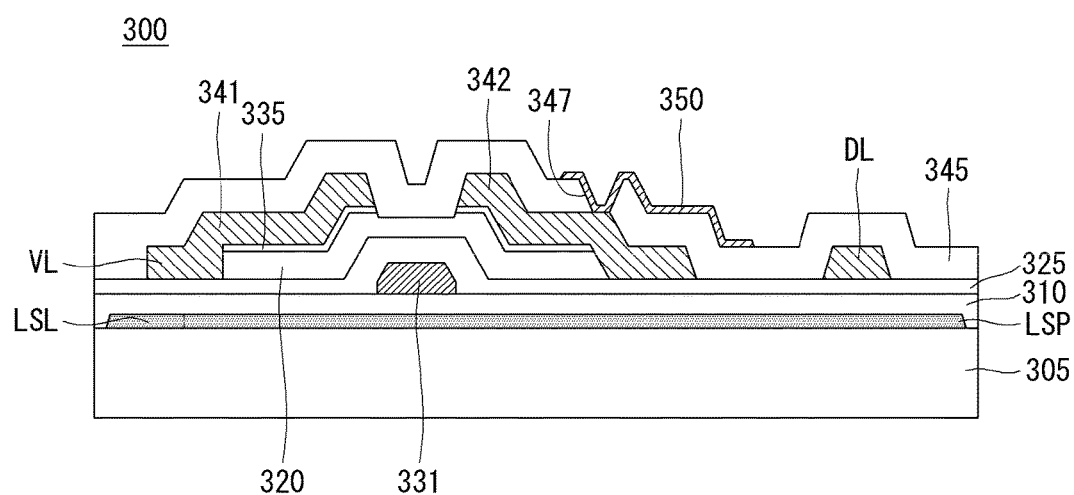

Next, as shown in FIG. 9E, the passivation layer 345 is positioned on the substrate 305, on which the source electrode 341 and the drain electrode 342 are formed. A portion of the passivation layer 345 corresponding to the drain electrode 342 is etched to form the via hole 347 exposing the drain electrode 342. Subsequently, the pixel electrode 350 is formed on the substrate 305, on which the passivation layer 345 is formed. Thus, the thin film transistor array substrate 300 according to the embodiment of the invention is manufactured.

As described above, the thin film transistor array substrate according to the embodiments of the invention includes the shielding pattern, thereby improving the reliability of external light. Further, the thin film transistor array substrate according to the embodiments of the invention applies the constant voltage to the shielding pattern, thereby improving the initial characteristic dispersion of the thin film transistor.

Furthermore, the thin film transistor array substrate according to the embodiments of the invention performs the thermal process on the active layer containing oxide and removes hydrogen ($H_2$ and H) or hydroxide ions (OH) preventing the movement of carriers inside the active layer, thereby improving the characteristics of the active layer.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A thin film transistor array substrate comprising:
   a plurality of pixel units defined by a cross structure of gate lines with data lines and power lines on a substrate, each of the plurality of pixel units including:
      a driving unit, which includes a switching thin film transistor and a driving thin film transistor receiving a signal from the gate line, the data line, and the power line, and a capacitor storing a signal; and
      a light emitting unit emitting light on a pixel electrode receiving a driving current from the driving thin film transistor; and
   a plurality of shielding patterns, each of which is positioned under the switching thin film transistor and the driving thin film transistor of each pixel unit;
   wherein the shielding pattern of one pixel unit is connected to the shielding patterns of other pixel units adjacent to the one pixel unit through shielding lines, and
   wherein the switching thin film transistor and the driving thin film transistor each have a bottom gate structure, and the shielding line is positioned to overlap at least one of the data line and the power line.

2. The thin film transistor array substrate of claim 1, wherein the switching thin film transistor and the driving thin film transistor each include an etch stopper.

3. A method for manufacturing a thin film transistor array substrate comprising:

forming a shielding pattern on a substrate, on which a plurality of pixel units each including a driving unit and a light emitting unit are to be defined;

forming gate lines, data lines, power lines, a capacitor storing a signal, a switching thin film transistor and a driving thin film transistor, wherein the switching thin film transistor and the driving thin film transistor each includes an active layer, a gate electrode, a source electrode, and a drain electrode, on the substrate, on which the shielding pattern is formed and overlaps with the capacitor, the switching thin film transistor and the driving thin film transistor; and forming a pixel electrode connected to the driving thin film transistor, wherein the shielding pattern is formed under the switching thin film transistor and the driving thin film transistor, and wherein the shielding pattern of one pixel unit is connected to the shielding patterns of other pixel units adjacent to the one pixel unit through shielding lines that are parallel with and overlap with the power lines.

4. The method of claim 3, wherein the shielding lines are connected to a constant voltage driver around an active area of the thin film transistor.

5. The method of claim 3, wherein the switching thin film transistor and the driving thin film transistor each have a top gate structure, and the shielding line is positioned to overlap at least the power line.

6. The method of claim 3, wherein the switching thin film transistor and the driving thin film transistor each have a bottom gate structure, and the shielding line is positioned to overlap at least the power line.

7. The method of claim 6, wherein the switching thin film transistor and the driving thin film transistor each include an etch stopper.

8. The method of claim 3, wherein each of the switching thin film transistor and the driving thin film transistor is formed on a buffer layer positioned on the substrate, and the shielding pattern is positioned between the substrate and the buffer layer.

9. The method of claim 4, wherein a constant voltage from the constant voltage driver is applied to the shielding pattern through the shielding line.

10. The method of claim 3, wherein the shielding pattern has a single layer or a multiple layer.

11. The method of claim 3, wherein the active layer contains oxide and after forming the active layer, the active layer is dehydrated from hydrogen and/or hydroxide ions by a thermal process performed at about 300° C. to 800° C.

12. The method of claim 3, wherein the shielding pattern is formed with an opening that entirely exposes the light emitting unit.

* * * * *